United States Patent [19]

Dietrich et al.

[11] 4,398,204

[45] Aug. 9, 1983

[54] CIRCUIT FOR OPERATING RECORDING NOZZLES

[75] Inventors: Klaus Dietrich, Stockdorf; Reiner Lichti, Germering; Günter Rosenstock, Munich, all of Fed. Rep. of Germany

[73] Assignee: Siemens Aktiengesellschaft, Berlin & Munich, Fed. Rep. of Germany

[21] Appl. No.: 296,971

[22] Filed: Aug. 27, 1981

[30] Foreign Application Priority Data

Sep. 30, 1980 [DE] Fed. Rep. of Germany ....... 3036922

[51] Int. Cl.[3] ...................... G01D 15/18; H01L 41/10

[52] U.S. Cl. .................... 346/140 346/140 R; 310/317

[58] Field of Search ................... 346/75, 140; 310/317

[56] References Cited

U.S. PATENT DOCUMENTS 4,282,535 8/1981 Kern et al. .................. 346/140 PD

*Primary Examiner*—Donald A. Griffin

*Attorney, Agent, or Firm*—Hill, Van Santen, Steadman, Chiara & Simpson

[57] ABSTRACT

A circuit for operating recording nozzles in ink mosaic recorders, each nozzle having an associated ink channel cylindrically surrounded by a piezoelectric transducer having a diameter which expands upon the application of a voltage thereto having a polarity which is opposite to the direction of polarization of the transducer and contracts upon the application of a voltage having a polarity in the direction of the transducer polarization, has a charging circuit which connects the transducers in a rest state to a common voltage source having a polarity in the direction of polarization of the transducers so that the transducers assume a state of contracted diameter. The circuit further includes a discharging circuit operated by a control input for each transducer operable for discharging an ink droplet from the nozzles after ink is drawn into the channels by operation of the charging circuit. The charging circuit contains a switching arrangement so that the charging circuit can be interrupted independently of the operation of the discharging circuit.

8 Claims, 7 Drawing Figures

CIRCUIT FOR OPERATING RECORDING NOZZLES

BACKGROUND OF THE INVENTION

1. Field of the Invention

The present invention relates to a circuit for operating recording nozzles in ink mosaic recorders, and in particular to such a circuit wherein the nozzles have an ink channel which is surrounded by a cylindrical piezoelectric transducer which has a diameter which expands upon the application of a voltage having a polarity opposite to the polarization direction of the transducer and which contracts or narrows upon the application of a voltage having a polarity which is opposite to the direction of the polarization.

2. Description of the Prior Art

A circuit for operating tubular piezoelectric transducers in recording nozzles of an ink mosaic recorder is known from German AS No. 25 48 691, corresponding to U.S. Pat. No. 4,161,670. As disclosed therein, the ejection of a droplet of ink is initiated by expansion of the piezoelectric transducers by the application of a voltage having a polarity which is opposite to the direction of the polarization of the transducers, followed by contraction of the transducers as a result of a reversal of the polarity of the operating voltage. The transducers normally are in the expanded condition which is thus referred to as the rest state. The expansion of the transducers lead to a small quantity of ink being drawn into the nozzle, whereas the narrowing of the transducer results in the ejection of a droplet of ink. In this known circuit, each piezoelectric transducer is assigned a voltage transformer having a primary side which contains a pulse evaluating stage and an amplifier stage. The secondary side inductance of the transformer forms an oscillating circuit in combination with the capacitance of the piezoelectric transducer. Pulsed operation on the primary side of the transformer results in the rising slope of the operating pulse on the secondary side inducing a surge of voltage having a polarity such that the transducer expands. Following the disconnection of the operating pulse, producing a declining slope, a voltage is induced in the opposite direction and triggers a contraction of the transducer. Suitable circuit means insure that the oscillation which occurs on the secondary side is attenuated such that it rapidly decays to substantially zero after a short length of time. An advantage of this circuit is that the voltage range available for the change in diameter of the transducer can be selected over a large number of values. This circuit has the disadvantage, however, that voltages occur, even though only temporarily, having a polarity which is opposite to the direction of polarity of the ceramic material comprising the piezoelectric transducer. Particularly at high voltages this can lead to a depolarization of the piezoelectric material over the course of time.

In order to avoid depolarization of the piezoelectric ceramic material, a circuit disclosed in U.S. patent 3,683,212 maintains the piezoelectric operating element in the rest state free of voltage. In this known circuit, a droplet of ink is ejected by means of a triggering by an operating pulse having a voltage with a polarity in the direction of polarization which is applied to the operating element. The resulting charging leads to a reduction in diameter of the element. At the end of the operating pulse a relatively slow discharge of the element takes place during which the element re-expands to its original diameter, corresponding to the rest state, and draws ink from a reservoir in readiness for the next actuation. Although this known circuit avoids the occurrence of voltages having a polarity which is opposite to the direction of polarization of the transducer element, the circuit requires a voltage source located directly in the control circuit which is assigned to each transducer and which must meet certain requirements such as, for example, a low internal impedence. Moreover, the voltage range of operation is limited because the charging of the transducer is restricted by the ratio of the charging resistor and the discharging resistor values. This circuit also permits ejection of a droplet of ink only in the sequence of a transducer contraction followed by a transducer expansion.

SUMMARY OF THE INVENTION

It is an object of the present invention to provide a circuit for operating piezoelectric transducers in recording nozzles in ink mosaic recorders which reliably avoids depolarization of the piezo-ceramic material even during long term operation.

It is another object of the present invention to provide such an operating circuit having essentially no limitation of the voltage range over which the circuit can be operated.

A further object of the present invention is to provide such an operating circuit which permits retention of the sequence of transducer expansion followed by transducer contraction which is favorable for the ejection of droplets of ink.

Another object of the present invention is to provide an operating circuit for recording heads having a plurality of recording nozzles and which permits individual adjustment of each operating circuit for each recording nozzle in a relatively simple manner.

The above objects are inventively achieved in an operating circuit for an ink mosaic recorder wherein the transducers employed cylindrically surround at least a portion of a channel leading to the nozzle from which ink is ejected and which transducers have diameters which expand upon the application of a voltage thereto having a polarity which is opposite to the direction of polarization of the transducer, and which transducers contract upon the application of a voltage of opposite polarity, that is, a voltage having a polarity in the direction of polarization of the transducer. In the rest state the transducers are connected via a charging circuit to a voltage source which is common to all of the transducers in a recording head and which voltage source has a polarity in the direction of polarization of the transducers so that the transducers assume a rest state of contracted diameter. Each nozzle has an individual discharging circuit which is operated by a control input for selectively causing the transducers to expand. The charging circuit contains a switching means so that the charging circuit can be interrupted independently of the operation of the discharging circuit and can thus be independently controlled.

One of the advantages which can be achieved by the above-described operating circuit is that a voltage is applied to each piezoelectric transducer in the rest state, which corresponds to the maximum value of the voltage having a polarity in the direction of the polarization of the transducer, and during operation results in the ejection of a droplet of ink when the applied voltage corresponds to a zero value. This manner of operation safely avoids depolarization of the transducers, even in the event of long and intensive operation while retaining a full voltage range over which the device can be operated.

DESCRIPTION OF THE PREFERRED EMBODIMENTS

Figure 1:
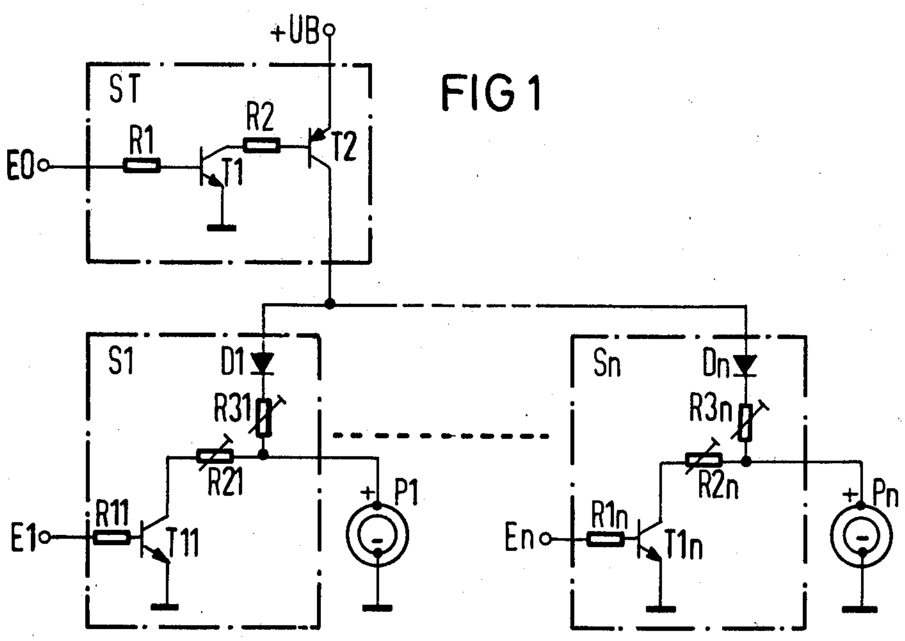
FIG. 1 is a circuit diagram of a first embodiment of a circuit for operating recording nozzles in an ink mosaic printer constructed in accordance with the principles of the present invention.

A first embodiment of a circuit for operating recording nozzles in an ink mosaic recorder constructed in accordance with the principles of the present invention is shown in FIG. 1 for operating n piezoelectric drive elements or transducers P1 through Pn, each of which is individually operated by a control circuit S1 and Sn assigned to each operating element. In the embodiment shown in FIG. 1, each element P1 through Pn has resistors R11 through R1n, R21 through R2n and R31 through R3n, a transistor T11 through T1n and a decoupling diode D1 through Dn. Each operating element P1 through Pn is connected to a charging circuit containing a common voltage source UB and which can be interrupted by a controllable switching device ST.

In the embodiment shown in FIG. 1, the switching device ST comprises two transistors T1 and T2 and two resistors R1 and R2. The polarity of the common voltage source UB corresponds to the direction of polarization of the individual operating elements P1 through Pn, which, in the rest state are charged to this voltage and assume a contracted state. For the element P1, for example, this is achieved in the rest state because the control input E1 for the control circuit S1 and the control input EO of the switching device ST are not energized. The transistor T11 is thus non-conducting and the transistor T2 is conducting. The operating element P1 is thus located in a charging circuit consisting of the voltage source UB, the transistor T2, the diode D1, the resistor R31, and the element P1 to ground and is thus charged by the positive voltage UB. This applies similarly to all of the other operating elements through Pn.

Upon the occurrence of a control pulse at one of the control inputs E1 through En, a discharging circuit is formed for the particular operating element associated with that circuit. For example, upon the occurrence of a control pulse at the control input E1, the transistor T11 becomes conducting so that a low-ohmic discharging circuit is formed through the transistor T11 and the resistor R21 in comparison to the operating element P1 so that current flows through the discharge circuit rather than through the operating element. The controllable switching device ST is simultaneously supplied with a pulse at the control input EO which results in the transistor T2 becoming non-conducting and as a result the charging circuit is interrupted. In this case, although the voltage UB is no longer available at all to the operating elements for a short length of time, this is of no consequence because the discharging circuits are connected only when a control pulse occurs at the respective control inputs for the discharging circuits.

Figure 2:
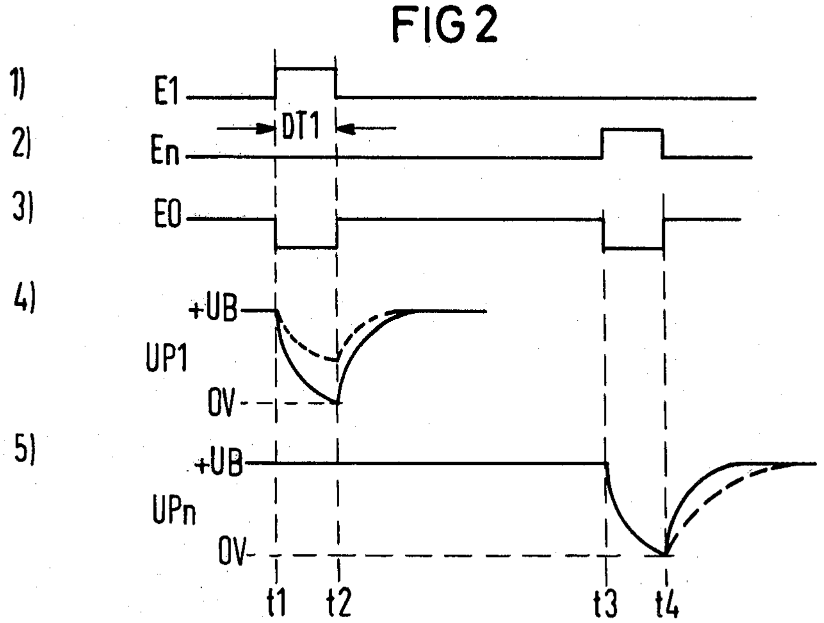
FIG. 2 is a voltage/time diagram showing a first manner of operating the circuit of FIG. 1 and the corresponding charging and discharging curves for the piezoelectric transducers.

The above manner of operation will be explained in greater detail with references to the voltage/time diagram shown in FIG. 2 wherein lines 1, 2 and 3 represent the pulse signals at the control inputs E1 and En and at the control input EO. Line 4 represents the curve of the voltage UP1 for the drive element P1 and line 5 represents the voltage curve for the voltage UPn for the drive element Pn. The pulse curve at the control input EO shown in line 3 is referred to as the fundamental pulse train, which supplies a control pulse at one of the control inputs E1 to En. It will be assumed that at a time t1 a control pulse having a duration DT1 occurs at the control input E1. During the same period of time the control input EO of the switching device ST is also connected to a control pulse which interrupts the charging circuit in the manner described above. With the control pulse E1, the discharging circuit for the operating element P1 is switched to the low-ohmic path identified above so that the operating element P1 is discharged. The fall of the voltage UP1 from a positive value UB to 0 volts with a time constant determined by the resistor R21 and the capacitance of the operating element P1 is shown in line 4 of FIG. 2. The operating element P1 thus expands its diameter and draws a small quantity of ink into the nozzle or channel which it surrounds. At the end of the control pulse E1 at the time t2, the discharging circuit is interrupted as a result of the transistor T11 again becoming non-conducting and at the same time the charging circuit is again closed. The operating element P1 is thus charged to the voltage value UB of the common voltage source with a time constant which is determined by the resistor R31 and the capacitance of the operating element. The operating element P1 now contracts and ejects a droplet of ink. These processes are repeated at the times t3 and t4 for the operating element Pn and at various times inbetween for the intervening operating elements.

The circuit shown in FIG. 1 allows, in a very simple manner, an individual adjustment of the circuit by varying the resistance values in the discharging and/or charging circuits. For this purpose, the resistors R21 through R2n can be varied in the discharging circuits, and the resistors R31 through R3n can be regulated in the charging circuit, and are shown in the diagram as variable resistors for this purpose. This provides the possibility of influencing the voltage curves UP1 through UPn for the individual operating elements in two ways. The discharging voltage can be adjusted by means of the resistors in the discharging circuit while the charging gradient can be adjusted by modifying the resistors in the charging circuit. The first manner of adjustment of the circuit is represented in line 4 in dashed lines, and the second manner of adjusting the circuit is shown in line 5 in broken lines.

An advantage associated with the circuit disclosed herein and described above consists in that full discharge range of an operating element from a value corresponding to the positive common voltage source UB through 0 volts is achieved because the discharging process of an operating element is not limited as in conventional circuits by the ratio of the charging resistors and the discharging resistors. As a result, the full voltage range is available to all operating elements.

Figure 3:
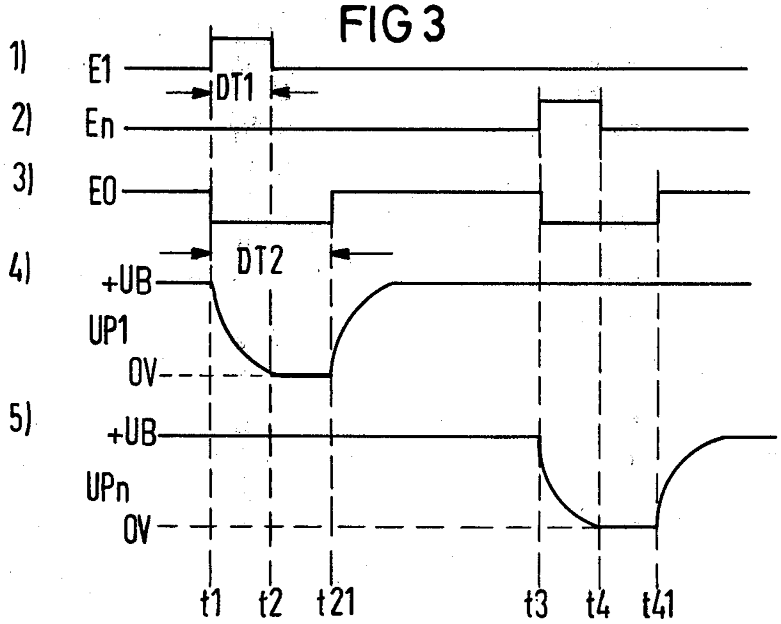
FIG. 3 is a voltage/time diagram showing a second manner of operating the circuit of FIG. 1 and the corresponding charging and discharging curves of the piezoelectric transducers.

The use of a controllable switching device ST, by means of which the charging circuit can be interrupted, provides the further possibility of extending the pulses across the operating elements P1 through Pn by an additional flat component having an amplitude equal to the discharging voltage. An example of one manner of operating the circuit in this respect is shown in FIG. 3. The control pulse EO for the fundamental pulse train, which in each case occurs with a control pulse of duration DT1 at the control input E1 (line 1) and that the control input En (line 2), is in this case extended by a selected amount which, for example, in the embodiment shown in FIG. 3 is a time DT2 which is equal to two times DT1. The discharging of the actuated operating element, for example, the operating element P1, occurs between the times t1 and t2 in the manner described above with reference to FIG. 2. In the manner of operating the circuit according to FIG. 3, however, the voltage source UB is not reconnected until the time t21 because of the longer control pulse EO, so that the charging to the voltage UB does not take place until this later point in time. The operating element Pn is similarly actuated at the time t3 and the charging to the voltage UB commences at the later time t41. The same adjustments to the time constants for the charging and discharging circuits can be made in the manner described with reference to FIGS. 1 and 2. The switching on and off of the switching device ST at selected times achieves the advantage of permitting the time of ejection of the droplet of ink to be specifically set relative to the time of commencement of the actuation of an operating element. This permits a particularly favorable matching of the contraction of the operating element which results in the ejection of a droplet of ink to the reflection properties resulting from the geometric dimensions of the recording nozzle.

Figure 4:
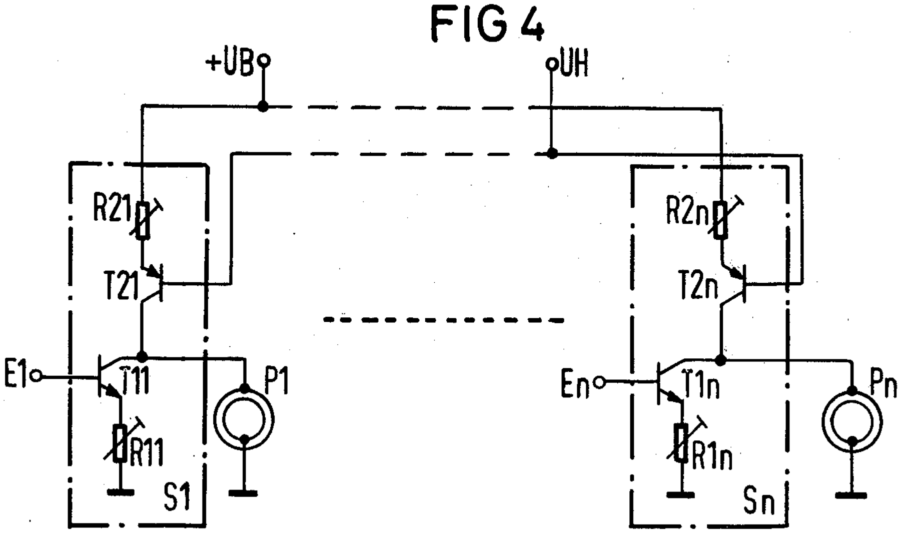
FIG. 4 is a second embodiment of a circuit for operating recording nozzles in an ink mosaic recorder constructed in accordance with the principles of the present invention employing constant current sources.

A second embodiment of a circuit for operating recording nozzles in ink mosaic printers which is within the scope of the invention disclosed and claimed herein is shown in FIG. 4. A common voltage source UB is again provided, however, the charging and discharging of the individual operating elements P1 through Pn in the circuit of FIG. 4 is effected by means of transistors T21 through T2n, which are connected as constant current sources and each of which form part of the individual control circuits S1 through Sn. The charging circuit also contains an auxiliary voltage UH. The difference between the voltage UB and the voltage UH is greater than zero and may be, for example, 5 volts. When the individual operation elements P1 through Pn are in the rest state, the transistors T11 through T1n in the respective control circuits S1 through Sn are non-conducting, whereas the transistors T21 through T2n are conducting. As a result, the operating elements P1 through Pn are connected to the voltage source UB, which has a polarity corresponding to the direction of polarity of the operating elements P1 through Pn. As in the previously described exemplary embodiment, the operating elements P1 through Pn now assume a contracted state.

Figure 5:
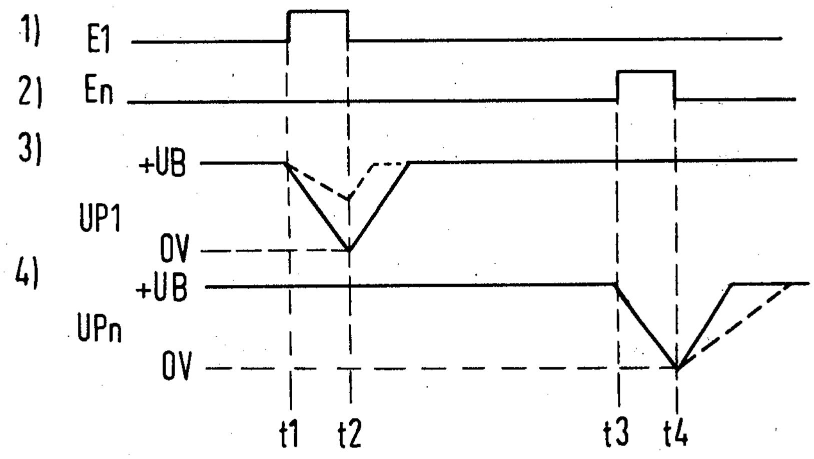
FIG. 5 is a voltage/time diagram of the manner of operating the circuit of FIG. 4 and the corresponding charging and discharging curves for the piezoelectric transducers.

Further operation of the circuit of FIG. 4 will be described with reference to the voltage/time diagram shown in FIG. 5. In the rest state of the operating elements, a constant charging current determined fundamentally by the resistors R21 through R2n is available through the transistors T1 through T2n, which act as constant current sources. The operating elements are charged to the value of the voltage source UB. If at the time t1 a control pulse occurs at the control input E1 (FIG. 5, line 1), the transistor T11 becomes conducting and a discharging current flows through the base-emitter path of the transistor T11 which is determined fundamentally by the amplitude of the control pulse and by the resistor R11. The operating element P1 is thus discharged with the difference current determined by the discharging current and the charging current. Discharging occurs whenever the discharging current is greater than the charging current. This can be achieved by a suitable dimensioning of the resistors and/or of the operating pulse. If, for example, the discharging current is double the magnitude of the charging current, the operating element in question is completely discharged (FIG. 5, line 3), even when the charging current is not interrupted. If, at the time t2, the control pulse at the control input E1 has come to an end, the operating element P1 is recharged to the value of the voltage UB with a constant charging current (FIG. 5, line 5). These processes occur in the same manner when an operating pulse occurs at the control input En between the times t3 and t4 (FIG. 5, line 2 and line 4).

Adjustment can be made either by adjustment of the discharging current which determines the pulse amplitude, or by adjustment of the charging current which determines the charging gradient. The first possibility is shown in dashed lines in line 3 of FIG. 5 and the second manner of adjustment is shown in dashed lines in line 4 of FIG. 5. In the first case, the adjustment is effected by adjusting the resistor in the respective emitter circuit of the transistor located in the discharging circuit, and in the second case the adjustment is effected by adjusting the resistor in the respective emitter circuit of the transistor located in the changing circuit. In the example shown in FIG. 4, these resistors are the resistors R11 through R1n and R21 through R2n. A further adjustment, however, can be made within the scope of the principles of the present invention by insertion of a variable resistor in the base circuit of the transistors in the discharging circuit and the charging circuit. An example of this type of an end stage is shown in FIG. 6.

Figure 6:
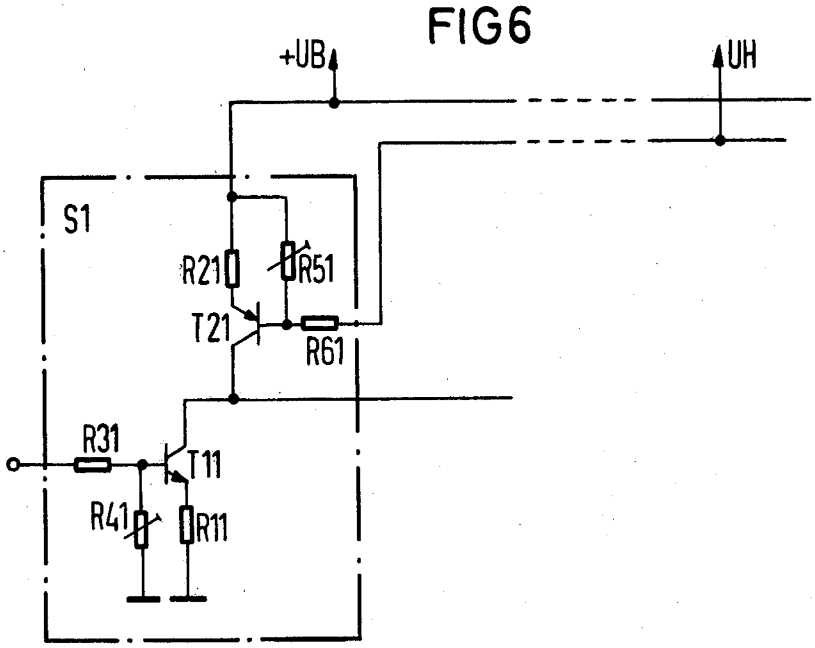
FIG. 6 is a third embodiment of a circuit for operating recording nozzles in an ink mosaic recorder constructed in accordance with the principles of the present invention employing a combination of constant current sources and resistors in the charging and discharging circuits.

In the embodiment shown in FIG. 6 the control circuit S1, which is assigned to the operating element P1, has additional resistors R31, R41, R51 and R61, of which the resistors R41 and R51 and are respectively connected in the base circuits of the transistors T11 and T21. As was described in connection with the embodiment shown in FIG. 1, the expanded state of the operating elements which occurs following the discharge of the operating elements can also be extended by interrupting the charging circuits for the extension period.

For this purpose the circuit can be extended by the controllable switching device ST which is illustrated in FIG. 1 and which in this examplary embodiment can also be connected between the auxiliary voltage UH and the constant current sources and can either disconnect or short-circuit the constant current sources.

Figure 7:
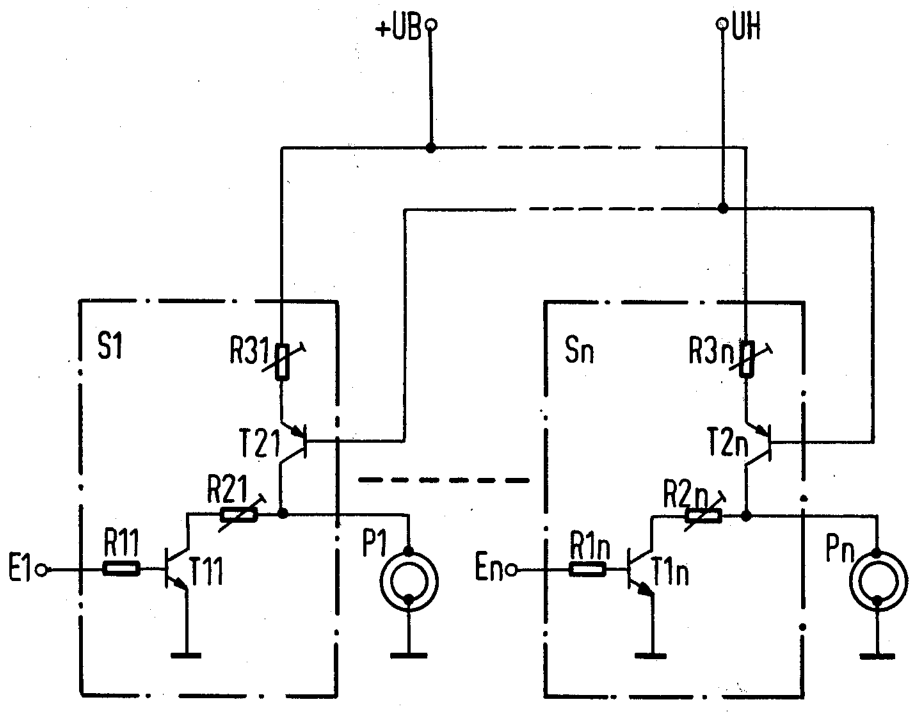
FIG. 7 is a fourth embodiment of a circuit for operating recording nozzles in an ink mosaic recorder constructed in accordance with the principles of the present invention in which the charging and discharging circuits are combined.

An embodiment in which the charging and discharging of the operating elements through resistors are combined with the charging and discharging with a constant current is shown in FIG. 7. In the embodiment of FIG. 7, each control circuit S1 through Sn, assigned to an operating element P1 through Pn, has a discharging circuit consisting of the elements T11 and R21 through the elements T1n and R2n which can be operated by the control inputs E1 through En, as well as a transistor T21 through Tn, which serves as a constant current source in the charging circuit. Also provided are the common voltage source UB and the auxiliary voltage UH. In order that each control circuit may be adjusted, the resistors R21 through R2n may be varied in the discharging circuit, whereas the resistors R31 through R3n can be varied in the charging circuit. In the rest state of the embodiment shown in FIG. 7 the operating elements P1 through Pn are charged to the common voltage UB with constant current. Upon the occurrence of a control pulse at one of the control inputs E1 through En, the operating element in question is discharged, through the transistors T11 through T1n which are then conducting, and with a time constant determined by one of the resistors R21 through R2n and the capacitance of the particular operating element in question, and is thereby expanded. At the end of the control pulse the discharging circuit is again interrutped and the charging of the respective operating element commences anew, whereby the element contracts and a droplet of ink is ejected. Again, by the use of the above-mentioned controllable switching device it is possible to extend the period of time during which an operating element is in the discharging (expanded) state beyond the duration of the operating pulse.

Each of the above-described embodiments of the invention disclosed and claimed herein can be easily integrated and thus can be used with particular advantage in the production of small recording heads having a large number of recording nozzles. Each of the above described embodiments has the common characteristic that when the current supply is switched on the operating elements are charged to the common voltage. Because this charging time is in the range of milliseconds, no droplets of ink are ejected during this charging process. In fact, the ejection of droplets of ink occurs only as a result of control pulses being present at the control inputs, thus insuring that the operating elements, which are contracted in the rest state of the circuit, first expand and subsequently, upon assuming a contracted state, eject a droplet of ink.

Although modifications and changes may be suggested by those skilled in the art it is the intention of the inventors to embody within the patent warranted hereon all changes and modifications as reasonably and properly come within the scope of their contribution to the art.

We claim as our invention:

1. A circuit for operating a plurality of recording nozzles in an ink mosaic recorder, each said recording nozzle having an associated channel which is cylindrically surrounded by a piezoelectric transducer having a diameter which expands upon the application of a voltage to said transducer having a polarity opposite to a direction of polarity of said transducer and which contracts upon the application of a voltage to said transducer having a polarity corresponding to said direction of polarization of said transducer, said circuit comprising:

a charging circuit for selectively connecting said transducers to a voltage source in a rest state, said voltage source being common to all said transducers and having a polarity in said direction of polarization of said transducers for causing said transducers to assume a state of contracted diameter;

a plurality of discharging circuits individually connected to said transducers and each operable by a separate control unput for discharging the transducer connected thereto to zero volts for causing said transducers to assume a state of expanded diameter for a selected period of time; and a switching means in said charging circuit for selectively interrupting operation of said charging circuit independently of the operation of said discharging circuit.

2. The circuit of claim 1 wherein said charging circuit for each transducer is comprised of a first resistor interconnected between a terminal of each of said transducers corresponding to the polarity of said common voltage source and said common voltage source; and wherein said discharging circuit for each transducer comprises a transistor connected to said control input for switching said transistor between conducting and non-conducting states and a second resistor interconnected between said terminal of said transducer and said transistor.

3. The circuit of claim 2 wherein said first resistor and said second resistor are each a variable resistor.

4. The circuit of claim 1 wherein said charging circuit for each transducer comprises a constant current source interconnected between a terminal of each transducer corresponding to the polarity of said common voltage source and said common voltage source; and wherein said discharging circuit comprises a transistor connected to said control input for switching said transistor between conducting and non-conducting states, said transistor being connected to said terminal of said transducer.

5. The circuit of claim 4 wherein said constant current source is a transistor connected to an auxiliary voltage and further comprising a resistor in said charging circuit for adjusting a charging current and an additional resistor in said discharging circuit for adjusting a discharging current, said resistor and said additional resistor being dimensioned such that said discharging current is greater than said charging current.

6. The circuit of claim 5 wherein said discharging current has a value which is twice the value of said charging current.

7. The circuit of claim 5 wherein said resistor and said additional resistor are each a variable resistor.

8. The circuit of claim 1 wherein said switching means is a controlled switching device for disconnecting said common voltage source for a selected period of time upon each actuation of said transducer.

* * * * *